Feb. 23, 1971 H. NELSON 3,565,702
DEPOSITING SUCCESSIVE EPITAXIAL SEMICONDUCTIVE LAYERS FROM THE LIQUID PHASE
Filed Feb. 14, 1969
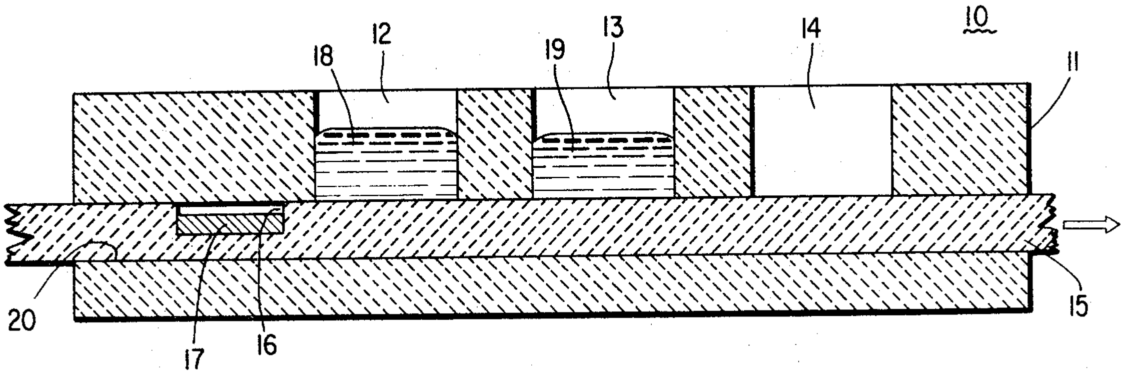
INVENTOR
Herbert Nelson
BY Abraham Sherman
ATTORNEY

United States Patent Office 3,565,702
Patented Feb. 23, 1971

3,565,702

DEPOSITING SUCCESSIVE EPITAXIAL SEMICONDUCTIVE LAYERS FROM THE LIQUID PHASE

Herbert Nelson, Princeton, N.J., assignor to RCA Corporation, a corporation of Delaware Filed Feb. 14, 1969, Ser. No. 799,209
Int. Cl. H01l 7/38, 7/46
U.S. Cl. 148—172 4 Claims

ABSTRACT OF THE DISCLOSURE

Successive layers of crystalline semiconductive material are deposited on a substrate from the liquid phase by bringing one surface of the substrate in contact with a first solution consisting of a first semiconductive material dissolved in a first molten metallic solvent. The first solution is cooled to deposit a first epitaxial layer consisting of said first semiconductive material on the substrate surface. While the surface of the first epitaxial layer is still covered with a liquid film of said first solution, the first epitaxial layer is brought in contact with a second solution consisting of a second semiconductive material dissolved in a second molten metallic solvent. The second solution is cooled to deposit a second epitaxial layer consisting of the second semiconductive material on the first epitaxial layer. According to one embodiment, the first and second solutions consist of the same semiconductive materials dissolved in the same solvents, but the first solution contains a conductivity modifier of given conductivity type, while the second solution contains a conductivity modifier of the opposite conductivity type.

BACKGROUND OF THE INVENTION

This invention relates to the deposition of epitaxial semiconductive layers, and more particularly to improved methods of depositing successive epitaxial layers on a substrate by the solution growth technique.

Epitaxial layers of crystalline semiconductive material have been deposited on a crystalline substrate by flooding a surface of the substrate with a solution of a semiconductive material dissolved in a molten metallic solvent; cooling the solution so that a portion of the dissolved semiconductive material precipitates and deposits on the substrate as an epittxial layer; then decanting the remainder of the solution. This method is known as solution growth, or liquid phase epitaxy. For a detailed description, see H. Nelson, "Epitaxial Growth from the Liquid State and Its Application to the Fabrication of Tunnel and Laser Diodes," RCA Review 24, p. 603, 1963. The solution may include a single given conductivity type modifier, so that the deposited epitaxial layer is of given conductivity type. Alternatively, the solution may contain two different conductivity type modifiers of mutually opposite types. The concentrations and solubilities of these two modifiers can be selected such that the first deposited portion of the epitaxial layer is of one conductivity type, while the subsequently deposited portion is of the opposite conductivity type. For details, see U.S. Pat. No. 3,158,512, issued Nov. 24, 1964 to H. Nelson et al.

The solution growth method has been utilized to deposit on a substrate some III–V compound semiconductors, for example gallium arsenide, as epitaxial layers containing a PN junction, although the solution utilized contained only a single conductivity modifier. This is possible because certain conductivity modifiers, such as silicon and germanium, are amphoteric in these compound semiconductors. These amphoteric modifiers are incorporated in different portions of the crystal lattice of the epitaxial semiconductive layer, depending on the temperature of deposition, and hence may act as donors if incorporated in the epitaxial lattice at one temperature, and act as acceptors if incorporated in the lattice at a lower temperature. For details, see for example H. Kressel et al., "Luminescence in Silicon-Doped GaAs Grown by Liquid-Phase Epitaxy," Journal Applied Physics, vol. 39, No. 4, pp. 2006–2011, March 1968.

For the fabrication of electroluminescent diodes, it is desirable to deposit successive epitaxial layers of mixed compound semiconductors, meaning materials having the formula $B_aAl_bGa_cIn_dN_eP_fAs_gSb_h$, wherein the substrates *a, b, c, d, e, f, g* and *h* may vary from 0 to 1, and $a+b+c+d=1$, and $e+f+g+h=1$. However, the fabrication of successive epitaxial layers of these mixed semiconductive materials has hitherto been difficult, particularly when it is required that the successive layers be of mutually opposite conductivity types and of good crystal quality.

SUMMARY OF THE INVENTION

Successive epitaxial semiconductive layers are deposited on a substrate from the liquid phase by bringing one surface of the substrate in contact with a first solution consisting of a first molten metallic solvent in which a first semiconductive material is dissolved; cooling the first solution sufficiently to deposit a first epitaxial layer of the first semiconductive material on the substrate; while the surface of the first epitaxial layer is still covered with a liquid film of the first solution, bringing the first epitaxial layer in contact with a second solution consisting of a second molten metallic solvent in which semiconductive material is dissolved; and cooling the second solution sufficiently to deposit a second epitaxial layer of semiconductive material on the first epitaxial layer. According to one embodiment, the first solution includes a given conductivity type modifier, while the second solution includes an opposite conductivity type modifier.

DESCRIPTION OF THE DRAWING

In the drawing:

The single figure is a cross-sectional view of apparatus useful in the practice of the invention.

THE PREFERRED EMBODIMENTS

Example I

Referring to the drawing, the apparatus 10 comprises a refractory furnace boat 11 which suitably consists of an inert material such as graphite. The upper surface of the boat 11 is provided with three wells or bins, 12, 13 and 14. The boat 11 is equipped with a movable slide 15, which is suitably made of a refractory material such as graphite. The slide 15 is disposed in a recess 20 near the bottom of the boat 11, so that the upper surface of slide 15 is coplanar with the plane of the bottom of each of the wells or bins 12, 13 and 14. Preferably, the first two bins 12 and 13 are spaced not more than 1 centimeter apart. A slot 16 is provided in the upper surface of the slide 15, near one end of the slide. The slot 16 is large enough to accommodate the substrate which is to be utilized, and the depth of the slot 16 is suitably about 100 microns more than the thickness of the substrate. The substrate 17 is positioned in the slot 16 so that the substrate surface to be deposited is uppermost. The precise size, shape and composition of the apparatus 10 is not critical. Advantageously, the exposed upper surface of the substrate 17 is parallel to the upper surface of the slide 15, and the substrate 17 nearly fills the slot 16. A quantity of the first solution 18 is placed in the bin 12, and a quantity of the second solution 19 is placed in the bin 13.

The size, shape and composition of the substrate 17 is not critical. In this example, the semiconductive substrate 17 consists of N conductivity type gallium arsenide, and is in the form of a rectangular slice about 2 cm. long, about 1 cm. wide, and about 0.3 mm. thick. Suitably, the exposed upper surface of the substrate 17 is cleaned and polished before the substrate 17 is positioned in the slot 16 of the slide 15. A first charge is introduced into the bin 12, and a second charge is introduced into the bin 13. In this example, the first charge consists of 5.0 grams gallium, 0.7 gram gallium arsenide, 10 milligrams aluminum, and 3 milligrams tellurium. The second charge consists of 5.5 grams gallium, 0.7 gram gallium arsenide, 10 milligrams aluminum, and 80 milligrams zinc. The charges may be granulated solids at room temperatures. The loaded furnace boat 11 is then positioned in a furnace tube (not shown). A flow of high purity hydrogen is maintained through the furnace and over the furnace boat 11 while the temperature of the furnace tube and its contents is increased from about 20° C. to about 940° C. in about 20 minutes.

The power is then turned off, and the furnace boat with its contents is allowed to cool at a rate of about 3° to 5° C. per minute. At the temperatures thus attained, the first charge becomes the first melt or solution 18, consisting principally of gallium arsenide dissolved in molten gallium as the solvent. The second charge becomes the second melt or solution 19, which in this example consists principally of gallium arsenide dissolved in molten gallium. However, the first melt 18 includes a conductivity modifier (tellurium in this example) capable of acting as a donor and inducing N type conductivity in gallium arsenide, while the second melt 19 contains a conductivity modifier (zinc in this example) capable of acting as an acceptor and inducing P type conductivity in gallium arsenide.

When the temperature of the furnace boat 11 and its contents has reached about 930° C., the slide 15 is pulled in the direction shown by the arrow so that the substrate 17 becomes the floor of the first bin 12. The substrate 17 is allowed to remain in this position until the temperature reaches 880° C. During this time some of the gallium arsenide dissolved in the first melt 18 precipitates and deposits on the substrate 17 as a first epitaxial layer. Since some of the tellurium present in the first solution or melt 18 is incorporated in the crystal lattice of the first epitaxial layer, the layer thus deposited is of N conductivity type. Some of the aluminum present in the first solution 18 is also incorporated in the first epitaxial layer, and replaces some of the gallium atoms in the layer, so that the first epitaxial layer may be regarded as an alloy of gallium arsenide and aluminum arsenide, or as a mixed semiconductor having the formula $Ga_{1-x}Al_xAs$, where $x$ is less than 1. The first epitaxial layer thus deposited is suitably about 5 to 25 microns thick.

The slide 15 is now moved in the direction shown by the arrow so that the substrate 17 becomes the floor of bin 13. During this move of the substrate 17, the upper surface of the first epitaxial layer remains covered by a thin liquid film of the first melt 18.

The substrate 17 is now permitted to cool to a temperature of about 750° C. while in contact with the second melt 19. During this time a second epitaxial layer of gallium arsenide is deposited on the first epitaxial layer. The second epitaxial layer is of P type conductivity, because some zinc is incorporated in the crystal lattice of the second epitaxial layer. Some of the aluminum present in the second solution 19 is also incorporated in the second epitaxial layer, and replaces some of the gallium atoms in the layer, so that the second epitaxial layer is also a mixed compound semiconductive material having the general formula $Ga_{1-x}Al_xAs$, where $x$ is less than 1.

When the temperature of the furnace boat 11 reaches 750° C., the slide 15 is again moved in the direction shown by the arrow so that the substrate 17 becomes the floor of empty bin 14. The substrate 17 with its successive epitaxial layers is then cooled in the empty bin 14 to room temperature in a non-oxidizing ambient. The use of an empty bin for the cooling step is convenient, but is not necessary.

It has been found that the PN junction between two successive epitaxial semiconductive layers of opposite conductivity types thus deposited on a substrate exhibits improved electrical characteristics as compared to PN junctions made between two successive epitaxial semiconductive layers deposited on a substrate by conventional methods. It is believed that the improved junction quality is due to the presence of the liquid film of the first solution 18 which remains on the first epitaxial layer when the substrate 17 is moved from contact with the first solution 18 in the first bin 12 to contact with the second solution 19 in the second bin 13. The film of the first solution 18 is promptly dissolved in the much larger volume of the second solution 19, but deposition of the second epitaxial layer begins, and this gives improved continuity between the crystal lattice of the first epitaxial layer and the crystal lattice of the second epitaxial layer. When two successive epitaxial layers are deposited on a substrate by conventional methods, there is frequently a marked and undesirable discontinuity between the crystal lattice of the first epitaxial layer and the crystal lattice of the second epitaxial layer.

Example II

The successive epitaxial semiconductive layers deposited on a substrate may consist of dissimilar semiconductive materials, so that a heterojunction is formed between them. Moreover, the solvent utilized for the first solution need not be the same as the solvent utilized for the second solution. In this example, the substrate 17 consists of silicon. The first solution 18 consists of tin as the solvent in which some silicon and a small amount of an acceptor such as boron is dissolved. The second solution consists of lead as the solvent in which some germanium and a small amount of a donor such as phosphorus is dissolved. The silicon substrate 17 is first brought into contact with the first solution 18, and by cooling the first solution a first epitaxial layer consisting of P type silicon is deposited on the exposed surface of the substrate 17. While this first epitaxial layer is still covered with a film of the first solution 181, the slide 15 is moved into the direction of the arrow so that the substrate 18 comes in contact with the second solution 19. When the second solution 19 is cooled, an N type germanium epitaxial layer is deposited on the first epitaxial layer of P type silicon, forming a heterojunction between the two epitaxial layers.

It will be understood that the above examples are by way of illustration only, and not limitation. The conductivity types of the various substrates and layers may be reversed. Successive epitaxial layers may be deposited of the same conductivity type, but differing in resistivity. The method may also be utilized to deposit three or more successive epitaxial layers by increasing the number of solutions utilized. Various other modifications may be made without departing from the spirit and scope of the invention as set forth in the specification and appended claims.

What is claimed is:

1. The method of depositing on a substrate successive epitaxial layers of crystalline semiconductive material from the liquid phase, comprising the steps of bringing one surface of a substrate in contact with a first solution consisting of a first molten metallic solvent in which a first semiconductive material is dissolved;

cooling said first solution sufficiently to deposit a first epitaxial layer of said first semiconductive material on said one surface of said substrate;

while the surface of said first epitaxial layer is still covered with a liquid film of said first solution, bringing said first epitaxial layer in contact with a second solution consisting of a second molten metallic solvent in which a second semiconductive material is dissolved; and, cooling said second solution sufficiently to deposit a second epitaxial layer of semiconductive material on said first epitaxial layer.

2. The method as in claim 1, wherein said first solution contains a first dissolved conductivity modifier of given conductivity type, and said second solution contains a second dissolved conductivity modifier of opposite conductivity type.

3. The method as in claim 1, wherein said first and second solvents consist of the same material.

4. The method as in claim 1, wherein said first and second semiconductive materials consist of the same material.

References Cited

UNITED STATES PATENTS 3,278,342 10/1966 John et al. ---------- 148—1.6

OTHER REFERENCES

Trumbort, Kowalchik, and White, "Efficient Electroluminescence in Gap p-m Junctions Grown by Liquid-Phase Epitaxy on Vapor-Grown Substrates," J. Applied Physics vol. 38, No. 4, pp. 1987–8. (Mar. 15, 1967).

L. DEWAYNE RUTLEDGE, Primary Examiner

W. G. SABA, Assistant Examiner

U.S. Cl. X.R.

23—204, 301; 117—114, 201; 148—1.6, 171, 177; 252—62.3